(12) United States Patent  
Weiss et al.

(10) Patent No.: US 11,393,759 B2
(45) Date of Patent: Jul. 19, 2022

(54) ALIGNMENT CARRIER FOR INTERCONNECT BRIDGE ASSEMBLY

(71) Applicant: International Business Machines Corporation, Armonk, NY (US)

(72) Inventors: Thomas Weiss, Poughkeepsie, NY (US); Charles L. Arvin, Poughkeepsie, NY (US); Glenn A. Pomerantz, Kerhonkson, NY (US); Rachel E. Olson, Lagrangeville, NY (US); Mark W. Kapfhammer, Poughkeepsie, NY (US); Bhupender Singh, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 16/593,489

(22) Filed: Oct. 4, 2019

(65) Prior Publication Data
US 2021/0104464 A1    Apr. 8, 2021

(51) Int. Cl.
*H01L 21/68*    (2006.01)
*H01L 23/538*    (2006.01)
(Continued)

(52) U.S. Cl.
CPC ...... *H01L 23/5381* (2013.01); *H01L 21/6835* (2013.01); *H01L 23/49816* (2013.01); *H01L 24/09* (2013.01); *H01L 24/14* (2013.01); *H01L 24/81* (2013.01); *H01L 2224/0401* (2013.01); *H01L 2224/09177* (2013.01);
(Continued)

(58) Field of Classification Search
CPC ......... H01L 24/09; H01L 24/11; H01L 24/81; H01L 24/82; H01L 24/13; H01L 24/22; H01L 21/768
See application file for complete search history.

(56) References Cited

U.S. PATENT DOCUMENTS 8,227,904 B2    7/2012  Braunisch et al.
8,866,308 B2    10/2014 Roy et al.
(Continued)

FOREIGN PATENT DOCUMENTS

CN    103187377 A    7/2013
CN    107808873 A    3/2018
(Continued)

OTHER PUBLICATIONS

U.S. Appl. No. 16/256,344 entitled, "Precision Alignment of Multi-Chip High Density Interconnects", filed Jan. 24, 2019, 18 pages.
(Continued)

*Primary Examiner* — Hoa B Trinh
(74) *Attorney, Agent, or Firm* — Scully, Scott, Murphy & Presser, P.C.; L. Jeffrey Kelly, Esq.

(57) ABSTRACT

An alignment carrier, assembly and methods that enable the precise alignment and assembly of two or more semiconductor die using an interconnect bridge. The alignment carrier includes a substrate composed of a material that has a coefficient of thermal expansion that substantially matches that of an interconnect bridge. The alignment carrier further includes a plurality of solder balls located on the substrate and configured for alignment of two or more semiconductor die.

11 Claims, 6 Drawing Sheets

(51) Int. Cl.
*H01L 21/683* (2006.01)
*H01L 23/498* (2006.01)
*H01L 23/00* (2006.01)

(52) U.S. Cl.
CPC ............... *H01L 2224/09179* (2013.01); *H01L 2224/09515* (2013.01); *H01L 2224/14177* (2013.01); *H01L 2224/81815* (2013.01)

(56) References Cited

U.S. PATENT DOCUMENTS

| | | | |
|---|---|---|---|
| 9,275,955 | B2 | 3/2016 | Mahajan et al. |
| 9,418,966 | B1 | 8/2016 | Kwon et al. |
| 9,653,428 | B1 | 5/2017 | Hiner et al. |
| 9,859,244 | B2 | 1/2018 | Campbell et al. |
| 9,875,969 | B2 | 1/2018 | Braunisch et al. |
| 10,325,843 | B2* | 6/2019 | Zhang ................ H01L 23/5381 |
| 2002/0068381 | A1 | 6/2002 | Ference et al. |
| 2008/0258287 | A1 | 10/2008 | Kasuga |
| 2010/0248424 | A1 | 9/2010 | Luce et al. |
| 2015/0364422 | A1 | 12/2015 | Zhai et al. |
| 2017/0110419 | A1 | 4/2017 | Shih et al. |
| 2018/0068921 | A1 | 3/2018 | Wang et al. |
| 2018/0277512 | A1 | 9/2018 | Waidhas et al. |
| 2020/0273839 | A1* | 8/2020 | Elsherbini ............... H01L 25/50 |
| 2020/0357768 | A1* | 11/2020 | Shih ........................ H01L 24/20 |
| 2021/0134726 | A1* | 5/2021 | Braunisch ........... H01L 25/0652 |

FOREIGN PATENT DOCUMENTS

| | | |
|---|---|---|
| TW | 201108370 A | 3/2011 |
| WO | 2012086871 A1 | 6/2012 |
| WO | 2019030617 A1 | 2/2019 |

OTHER PUBLICATIONS

Yang, H. S., et al., "Self-Aligned Silicon Interposer Tiles and Silicon Bridges Using Positive Self-Alignment Structures and Rematable Mechanically Flexible Interconnects", IEEE Transactions on Components, Packaging and Manufacturing Technology, Nov. 2014, pp. 1760-1768,vol. 4, No. 11.

U.S. Appl. No. 16/043,503 entitled, "Multi-Chip Package Structure Having Chip Interconnection Bridge Which Provides Power Connections Between Chip and Package Substrate", filed Jul. 24, 2018, First named inventor: Joshua Rubin, 37 pages.

U.S. Appl. No. 16/256,344 entitled, "Precision Alignment of Multi-Chip High Density Interconnects", filed Jan. 24, 2019, first named inventor: Charles L. Arvin, 18 pages.

International Search Report and Written Opinion dated Nov. 27, 2020, 9 pages.

* cited by examiner

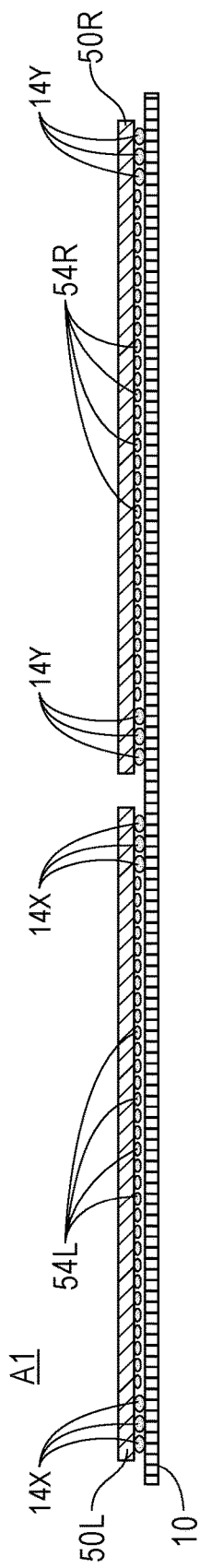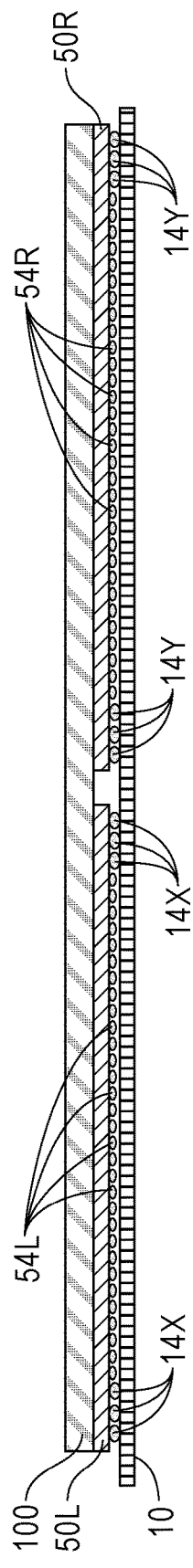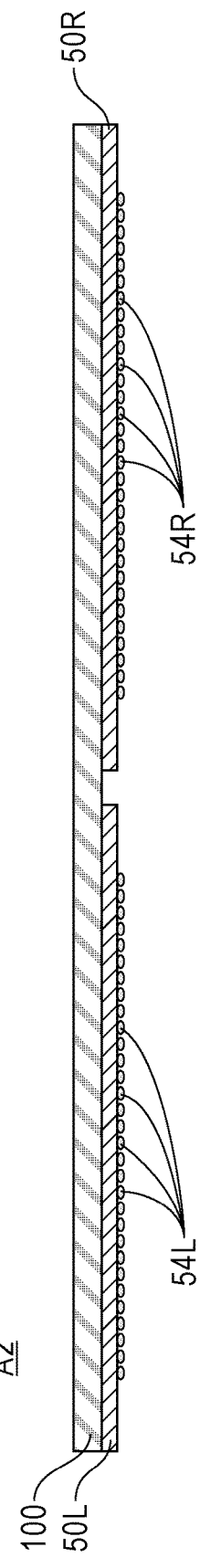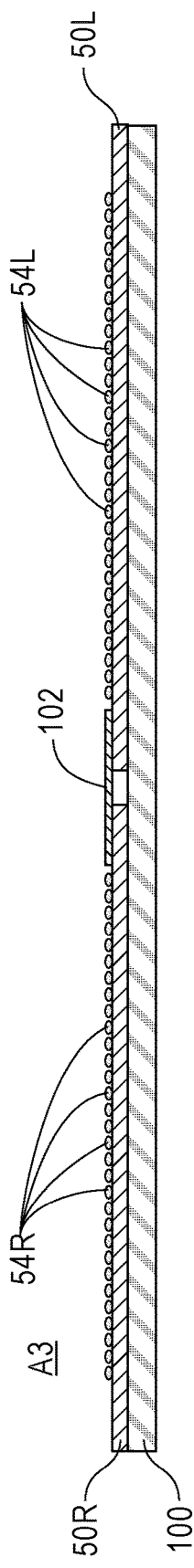

ALIGNMENT CARRIER FOR INTERCONNECT BRIDGE ASSEMBLY

BACKGROUND

The present application relates to semiconductor technology, and more particularly to the alignment and assembly of two or more semiconductor die using an interconnect bridge.

Semiconductor die (i.e., chips) have continued to become more complex and grow in size. This has resulted in lower yielding semiconductor die due to the defect density staying the same, but semiconductor die size having a greater chance to be impacted by random defects. In order to reduce yield loss, the semiconductor die are being split in size, but now need to have a greater amount of input/output (I/O) to communicate between chips at fast enough rates.

In order to enable fast communication between semiconductor die, wiring dimensions that are achievable in semiconductor fabrication are needed. Interconnect bridges, such as, for example, silicon (Si) bridges, have been attempted in the past. However, prior art interconnect bridges can lead to significant challenges in assembly. For example, multiple interconnect bridges are typically needed to assemble multiple semiconductor die. This makes alignment of interconnect bridge area between the semiconductor die and attachment of the interconnect bridge to multiple semiconductor die difficult in assembly.

Since the interconnect bridge connection area may be plated first and the large bump areas plated second, there is typically some mis-registration between the low density interconnect (LDI) regions and the high density interconnect (HDI) regions of the semiconductor die due to this two step plating process. This makes using the large pitch controlled collapse chip connection (C4s) solder for alignment in interconnect bridges less than ideal. At the same time, it is necessary to handle properly aligned semiconductor die while having attached a very thin interconnect bridge.

There is thus a need to provide alignment and assembly of two or more semiconductor die using an interconnect bridge that circumvents the problems noted above.

SUMMARY

The present application provides an alignment carrier, assembly and methods that enable the precise alignment and assembly of two or more semiconductor die using an interconnect bridge that circumvents the problems noted above.

In one aspect of the present application, an alignment carrier is provided that can be used for alignment and assembly of two or more semiconductor die (i.e., chips) using an interconnect bridge. In one embodiment of the present application, the alignment carrier includes a substrate having a coefficient of thermal expansion (CTE) that substantially matches that of an interconnect bridge. The alignment carrier further includes a plurality of solder balls located on a surface of the substrate and configured for alignment of two or more semiconductor die. In the present application, the solder balls that are present on the substrate of the alignment carrier are formed in locations that correspond to a periphery region of each semiconductor die that is to be subsequently aligned thereto.

In some embodiments, and when the interconnect bridge is composed of silicon, the substrate is composed of silicon or glass. In some embodiments, the solder balls of the alignment carrier are located on a surface of the substrate that corresponds to the corners of each of the semiconductor die to be aligned. In some embodiments of the present application, the alignment carrier includes a window (i.e., opening) that is located in a central region of the substrate. In such an embodiment, the window is configured for placement and access of the interconnect bridge. The presence of the window provides access to the high density interconnect (HDI) region of the semiconductor die for interconnect bridge placement.

In some embodiments, the plurality of solder balls that are present on the substrate have a size that is greater than solder balls that are present in a low density interconnect (LDI) region of the two or more semiconductor die. This size difference in the solder balls allows for the solder balls present on the substrate of the alignment carrier to contact sacrificial bond pads that are located at a periphery region of the semiconductor die, without allowing the solder balls present on the semiconductor die to contact the alignment carrier. In some embodiments of the present application, each solder ball of the plurality of solder balls is a controlled collapse chip connection (C4) solder ball.

In another aspect of the present application, an assembly is provided. In one embodiment of the present application, the assembly includes a first semiconductor die including a plurality of first sacrificial bond pads located at a periphery region of the first semiconductor die, first solder balls located in a low density interconnect (LDI) region of the first semiconductor die, and first bond pads located in a high density interconnect (HDI) region of the first semiconductor die. A second semiconductor die is located laterally adjacent to the first semiconductor die and includes a plurality of second sacrificial bond pads located at a periphery region of the second semiconductor die, second solder balls located in a LDI region of the second semiconductor die, and second bond pads located in a HDI region of the second semiconductor die.

The assembly further includes an alignment carrier that includes a substrate having a coefficient of thermal expansion that substantially matches that of an interconnect bridge, and a plurality of solder balls located on the substrate that correspond to the periphery region of the first semiconductor die and the second semiconductor die being aligned. In accordance with the present application, a first set of the plurality solder balls located on the substrate is aligned to, and in contact with, the plurality of first sacrificial bond pads located at the periphery region of the first semiconductor die, and a second set of the plurality solder balls located on the substrate is aligned to, and in contact with, the plurality of second sacrificial bond pads located at the periphery region of the second semiconductor die.

In some embodiments, the alignment carrier includes a window present in the central region of the substrate which corresponds to the HDI region of the first semiconductor die and the HDI region of the second semiconductor die allowing access for placement of the interconnect bridge. In some embodiments, the interconnect bridge present in the assembly is composed of silicon, and the substrate of the alignment carrier is composed of silicon or glass. In some embodiments, the plurality of first sacrificial bond pads are located at each corner of the first semiconductor die, and the plurality of second sacrificial bond pads are located at each corner of the second semiconductor die. In some embodiments of the present application, the plurality of solder balls of the alignment carrier have a size that is greater than the solder balls that are present in the first LDI region of the first semiconductor die and the second LDI region of the second semiconductor die. In some embodiments, a backer structure can be attached to a backside of the first semiconductor die and the second semiconductor die.

In some embodiments, an interconnect bridge is present in the assembly that spans the first semiconductor die and the second semiconductor die. In accordance with the present application, the interconnect bridge connects the HDI region of the first semiconductor die to the HDI region of the second semiconductor die.

In yet another aspect of the present application, a method for alignment and assembly of two or more semiconductor die (i.e., semiconductor chips) using an interconnect bridge is provided. In a first embodiment, the method includes providing a first assembly including a first semiconductor die, a second semiconductor die located laterally adjacent to the first semiconductor die, and an alignment carrier. The first semiconductor die includes a plurality of first sacrificial bond pads located at a periphery region of the first semiconductor die, first solder balls located in a low density interconnect (LDI) region of the first semiconductor die and first bond pads located in a high density interconnect (HDI) region of the first semiconductor die. The second semiconductor die includes a plurality of second sacrificial bond pads located at a periphery region of the second semiconductor die, second solder balls located in a LDI region of the second semiconductor die and second bond pads located in a HDI region of the second semiconductor die. The alignment carrier includes a substrate having a coefficient of thermal expansion that substantially matches that of an interconnect bridge, and a plurality of solder balls located on the substrate that corresponds to the periphery region of both the first semiconductor die and the second semiconductor die. In the first assembly, a first set of the plurality of solder balls located on the substrate is aligned to, and in contact with, the plurality of first sacrificial bond pads located at the periphery region of the first semiconductor die, and a second set of the plurality of solder balls located on the substrate is aligned to, and in contact with, the plurality of second sacrificial bond pads located at the periphery region of the second semiconductor die.

The method of the first embodiment further includes first attaching a backer structure to a backside of the first semiconductor die and the second semiconductor die. Next, the alignment carrier is removed to provide a second assembly including the first semiconductor die, the second semiconductor die and the backer structure. The method of the first embodiment continues by second attaching the interconnect bridge between the first semiconductor die and the second semiconductor die to provide a third assembly including the first semiconductor die, the second semiconductor die, the backer structure and the interconnect bridge. In the third assembly, the interconnect bridge connects the HDI region of the first semiconductor die to the HDI region of the second semiconductor die. The method of the first embodiment continues by third attaching a laminate to the third assembly.

In a second embodiment, the method includes providing a first assembly comprising a first semiconductor die, a second semiconductor die located laterally adjacent to the first semiconductor die, and an alignment carrier. The first semiconductor die includes a plurality of first sacrificial bond pads located at a periphery region of the first semiconductor die, first solder balls located in a low density interconnect (LDI) region of the first semiconductor die and first bond pads located in a high density interconnect (HDI) region of the first semiconductor die. The second semiconductor die includes a plurality of second sacrificial bond pads located at a periphery region of the second semiconductor die, second solder balls located in a LDI region of the second semiconductor die and second bond pads located in a HDI region of the second semiconductor die. The alignment carrier includes a substrate having a coefficient of thermal expansion that substantially matches that of an interconnect bridge, a window located in a central portion of the substrate, and a plurality of solder balls located on the substrate that corresponds to the periphery region of both the first semiconductor die and the second semiconductor die. In the first assembly, a first set of the plurality solder balls located on the substrate is aligned to, and in contact with, the plurality of first sacrificial bond pads located at the periphery region of the first semiconductor die, and a second set of the plurality solder balls located on the substrate is aligned to, and in contact with, the plurality of second sacrificial bond pads located at the periphery region of the second semiconductor die.

The method of the second embodiment further includes forming the interconnect bridge through the window and spanning the first semiconductor die and the second semiconductor die to provide a second assembly including the first semiconductor die, the second semiconductor die, and the interconnect bridge, wherein the interconnect bridge connects the HDI region of the first semiconductor die to the HDI region of the second semiconductor die, and thereafter first attaching a backer structure to a backside of the first semiconductor die and the second semiconductor die of the second assembly. Next, the alignment carrier is removed to provide a third assembly including the first semiconductor die, the second semiconductor die, the interconnect bridge and the backer structure. The method of the second embodiment continues by second attaching a laminate to the third assembly.

A third embodiment is also provided that is similar to the second embodiment but without attaching a backer structure to the first semiconductor die and the second semiconductor die during the assembly process.

In any of the method embodiments mentioned above, the plurality of first sacrificial bond pads are formed at the same time as the first bond pads in the HDI region of the first semiconductor die, and the plurality of second sacrificial bond pads are formed at the same time as the second bond pads in the HDI region of the second semiconductor die. By forming the sacrificial bond bands at the same time as the bond pads in the HDI region of the semiconductor die, mis-registration between the low density interconnect (LDI) regions and high density interconnect (HDI) regions of the semiconductor die due to a two step plating process is no longer of consequence for alignment of the HDI regions of the semiconductor die.

BRIEF DESCRIPTION OF THE DRAWINGS

FIG. 3 is a cross sectional view of a first assembly including the two semiconductor die of FIG. 2 aligned and attached to the alignment carrier of FIG. 1.

FIG. 4 is a cross sectional view of the first assembly of FIG. 3 after first attaching a backer structure to a backside of the first semiconductor die and the second semiconductor die.

FIG. 5 is a cross sectional view of the first assembly of FIG. 4 after removing the alignment carrier to provide a second assembly including the first semiconductor die, the second semiconductor die and the backer structure.

FIG. 6 is a cross sectional view of the second assembly of FIG. 5 after second attaching an interconnect bridge between the first semiconductor die and the second semiconductor die to provide a third assembly including the first semiconductor die, the second semiconductor die, the backer structure and the interconnect bridge, wherein the interconnect bridge connects a high density interconnect region of the first semiconductor die to a high density interconnect region of the second semiconductor die.

DETAILED DESCRIPTION

Figure 1:
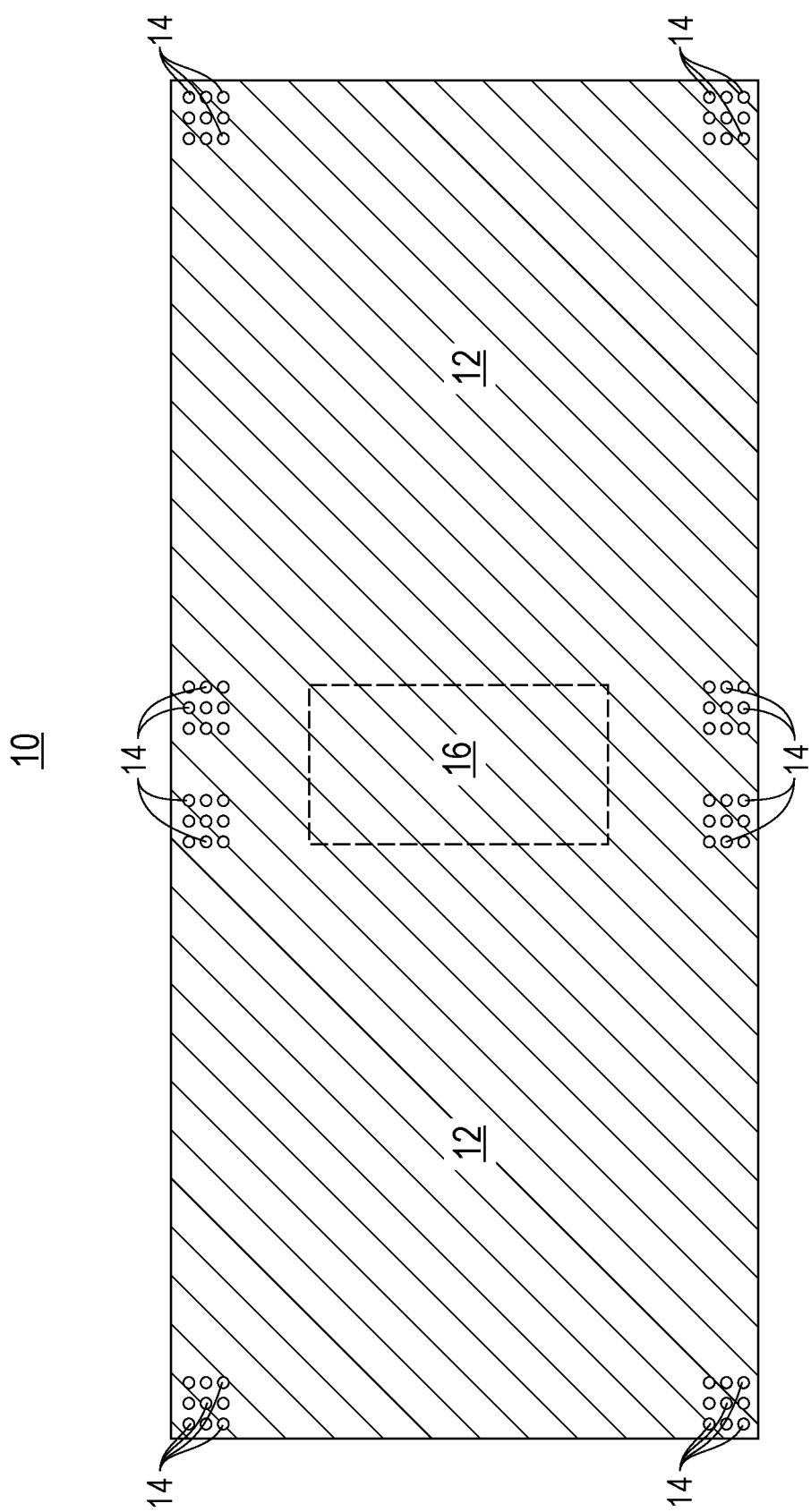
FIG. 1 is a top down view illustrating an alignment carrier in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an alignment carrier 10 in accordance with an embodiment of the present application. The alignment carrier 10 is used for the precise alignment and assembly of semiconductor die. The alignment carrier 10 includes a substrate 12 that contains a plurality of solder balls 14 located on a surface of the substrate 12. In accordance with the present application the solder balls are configured for alignment of two or more semiconductor die. Notably, the solder balls 14 that are present on substrate 12 are located in regions of the substrate 12 that corresponds to the periphery region of each of the semiconductor die being aligned thereto. By "periphery region" it is meant a region of a material that is located away from a central (or middle) region of the material; the periphery region of a material is typically near the edges of the material. In some embodiments of the present application, the plurality of solder balls 14 are located on the substrate 12 in regions that correspond to each corner of the semiconductor die that is to be subsequently aligned thereto.

The substrate 12 that provides alignment carrier 10 has coefficient of thermal expansion (CTE) that substantially matches that of an interconnect bridge; CTE is a measure of the change in a length of a material in response to a change in the temperature of the material. By "substantially matches" it meant that the substrate 12 has a CTE that is ±10%, preferably ±5%, more preferably ±2, from the CTE of the interconnect bridge. The substantial matching of the CTE of the substrate 12 with the interconnect bridge reduces mis-alignment during die assembly. The term "interconnect bridge" is used throughout the present application to denote a structure that is used during die assembly to connect a high density interconnect (HDI) region of one semiconductor die to a HDI region of another semiconductor die.

In one embodiment of the present application, and when the interconnect bridge is composed of silicon (Si), then substrate 12 is composed of silicon or glass. Other materials for substrate 12 can be used as long as the material selected for substrate 12 has a CTE that substantially matches the CTE of the interconnect bridge.

In some embodiments, a window 16 (i.e., opening) is located in a central region of the substrate 12 and is configured for placement and access of the interconnect bridge. When present, the window 16 can be formed by lithography and etching. Window 16 extends completely through substrate 12. Window formation can occur prior to, or after, solder ball 14 formation. The window 16 is designed to have a size that is larger than a size of the interconnect bridge.

In some embodiments of the present application, the plurality of solder balls 14 which are present on substrate 12 have a size that is greater than the solder balls that are present in a LDI region of the semiconductor die. The plurality of solder balls 14 that are present on substrate 12 can be composed of any conventional solder ball material. The solder ball material can contain lead or can be lead-free. In some embodiments, each solder ball of the plurality of solder balls 14 is a controlled collapse chip connection (C4) solder ball. In other embodiments, the solder balls 14 can be composed of a low temperature (150° C. or less) solder. The solder balls 14 that are present on the substrate 12 can be formed utilizing conventional techniques that are well known to those skilled in the art. In some embodiments, the solder balls 14 can be formed directly on the surface of substrate 12. In other embodiments (not shown), the solder balls 14 can be formed on a bond pad such as, for example, an under bump metallization (UBM) bond pad.

Figure 2:
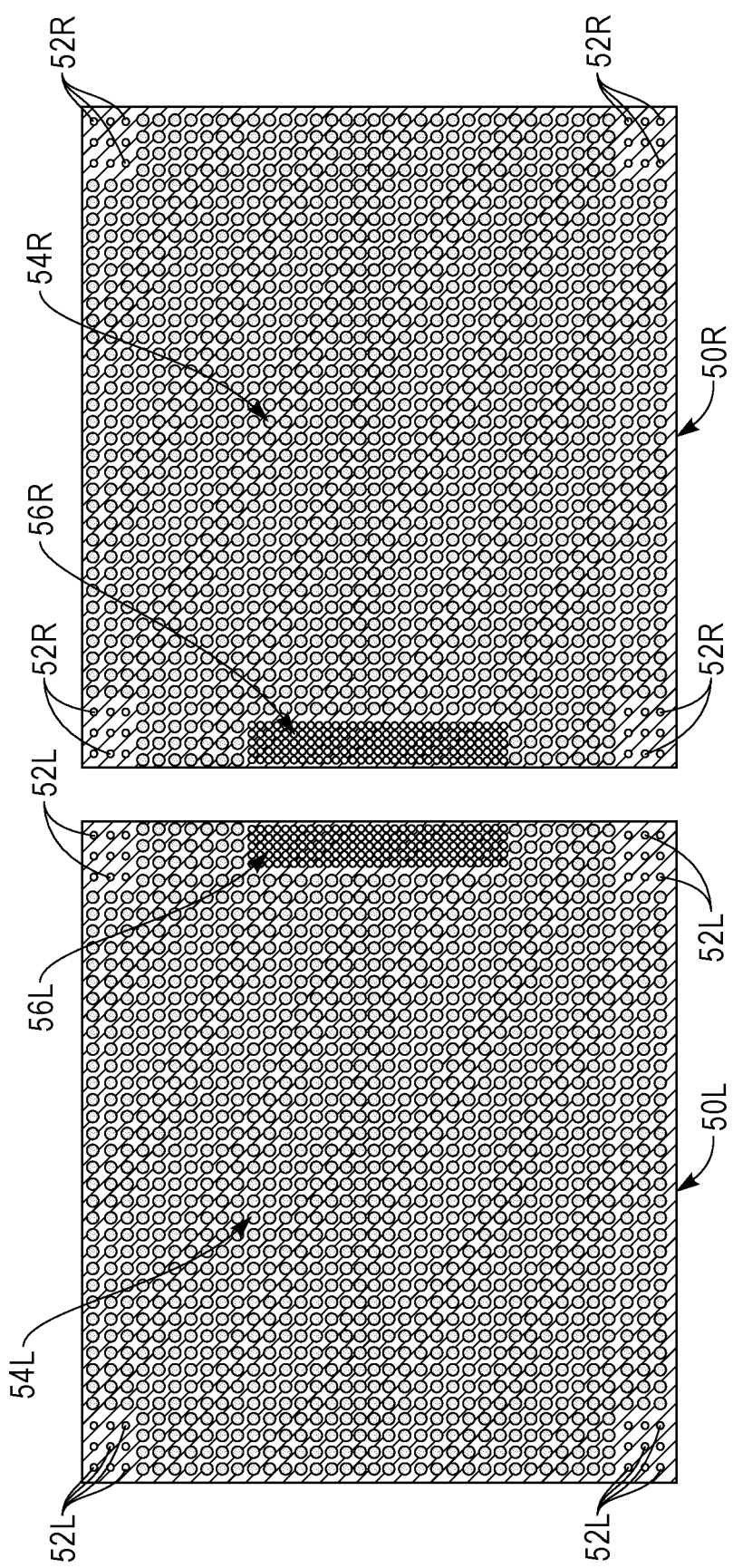
FIG. 2 is a top down view of two semiconductor die in accordance with an embodiment of the present application.

Referring now FIG. 2, there is illustrated two semiconductor die (50L, 50R) that can be used in accordance with the present application. Notably, FIG. 2 shows a first semiconductor die 50L and a second semiconductor die 50R. The first and second semiconductor die (50L, 50R) include materials and components that are well known to those skilled in the art. The first and second semiconductor die (50L, 50R) can be formed utilizing techniques that are also well known to those skilled in the art. So as not to obscure any aspect of the present application, details regarding the materials/components of the semiconductor die and the method used in forming the same are not provided herein. It is noted that although two semiconductor dies are described and illustrated, a plurality of semiconductor die can be used in the present application.

The first semiconductor die 50L includes a plurality of first sacrificial bond pads 52L located at a periphery region of the first semiconductor die 50L, first solder balls 54L located in a low density interconnect (LDI) region of the first semiconductor die 50L and first bond pads 56L located in a high density interconnect (HDI) region of the first semiconductor die 50L.

The second semiconductor die 50R includes a plurality of second sacrificial bond pads 52R located at a periphery region of the second semiconductor die 50R, second solder balls 54R located in a LDI region of the second semiconductor die 50R and second bond pads 56R located in a HDI region of the second semiconductor die 50R.

The term "LDI region" is used through the present application to denote an area of a semiconductor die in which solder bonds (54L, 54R) are present and those solder balls (54L, 54R) are spaced far apart from each other. In some embodiments, the pitch between each solder ball (54L, 54R) that is present in the LDI region can be from 100 microns to 200 microns.

The term "HDI region" denotes an area of a semiconductor die in which bond pads (56L, 56R) are present and those bond pads (56L, 56R) are spaced close to each other. In some embodiments, the pitch between each bond pad (56L, 56R) that is present in the HDI region can be from 10 microns to 100 microns.

The sacrificial bond pads (52L, 52R) are dummy features of the semiconductor die (50L, 50R) that are employed in the present application for alignment purposes. That is, the sacrificial bond pads (52L, 52R) of the semiconductor die (50L, 50R) can be joined to the solder balls 14 that are located on the substrate 12 that provides the alignment carrier 10. The semiconductor die (50L, 50R) will align to each other using the self-centering feature of mass reflow. The term "self centering" refers to the wetting force in conjunction with the surface tension of the solder ball pulling the component into the correct position on the bond pad during a solder reflow process. This allows for proper alignment of the HDI regions of the semiconductor die (50L, 50R) that need to have an interconnect bridge attachment.

In some embodiments of the present application, the sacrificial bond pads (52L, 52R) are present at the corners of each of the semiconductor die (50L, 50R). Corner placement for the sacrificial bond pads (52L, 52R) does not interfere with the LDI or HDI regions of the semiconductor die (50L, 50L) and, in some instances, provides for best alignment. The pitch between each sacrificial bond pads (52L, 52R) that is located at the periphery region of the semiconductor die (50L, 50R) can be from 100 microns to 400 microns.

In accordance with the present application, the plurality of first sacrificial bond pads 52L are formed at the same time as the first bond pads 56L in the HDI region of the first semiconductor die 50L, and the plurality of second sacrificial bond pads 52R are formed at the same time as the second bond pads 56R in the HDI region of the second semiconductor die 50R. By forming the sacrificial bond bands (52L, 52R) at the same time as the bond pads (56L, 56R) in the HDI region of the semiconductor die, mis-registration between the LDI regions and HDI regions of the semiconductor die due to a two step plating process is circumvented. In instances in which the features that were formed during the patterning of the LDI regions of the semiconductor die for alignment of the HDI regions are needed for interconnect bridge placement, the mis-registration between patterning of the LDI regions and the HDI regions could introduce alignment errors.

In some embodiments of the present application, the sacrificial bond pads (52L, 52R) can be of a same size as the bond pads (56L, 56R). In other embodiments of the present application, the sacrificial bond pads (52L, 52R) can have a size that is larger than a size of the bond pads (56L, 56R). In one example, the sacrificial bond pads (52L, 52R) are 2 times larger than the bond pads (56L, 56R).

The sacrificial bond pads (52L, 52R) and the bond pads (56L, 56R) may be composed of any conventional bond pad material (i.e., copper) or bond pad material stack. The sacrificial bond pads (52L, 52R) and the bond pads (56L, 56R) can be formed by deposition of the bond pad material or bond material stack and then subjecting the deposited layer(s) to a patterning process. Again the sacrificial bond pads (52L, 52R) and the bond pads (56L, 56R) that are present in the HDI region of the semiconductor die (50R, 50L) are formed at the same time.

The solder balls (54L, 54R) that are present in the LDI region of the semiconductor die (50L, 50R) are composed of any conventional solder ball material. Solder balls (54L, 54R) may be compositionally the same as, or compositionally different from, solder balls 14. In some embodiments, solder balls (54L, 54R) that are present in the LDI region of the semiconductor die (50L, 50R) is a controlled collapse chip connection (C4) solder ball. The solder balls (54L, 54R) that are present in the LDI region of the semiconductor die (50L, 50R) can be formed utilizing conventional techniques that are well known to those skilled in the art. The solder balls (54L, 54R) that are present in the LDI region of the semiconductor die (50L, 50R) generally have a size that is smaller than the size of the plurality of solder balls 14 that are present on substrate 12 of the alignment carrier 10. Smaller size solder balls (54L, 54R) as compared to solder balls 14 prevents unwanted interference of the solder balls (54L, 54R) with the alignment carrier 10 in the LDI regions of the semiconductor die.

Figure 7:
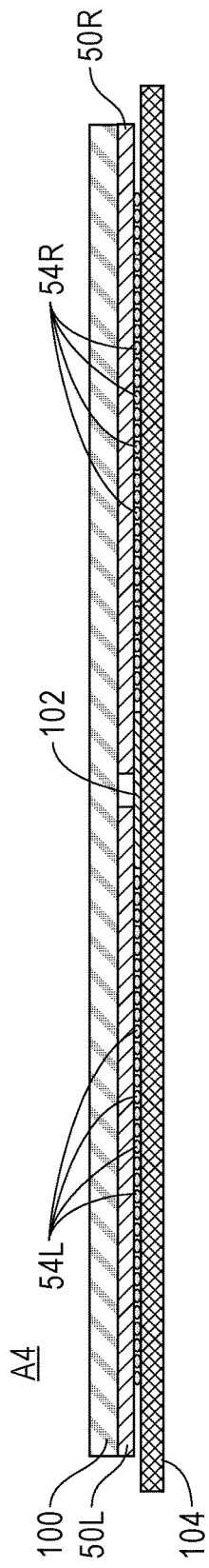
FIG. 7 is a cross sectional view of the third assembly of FIG. 6 after third attaching a laminate to the third assembly to provide a fourth assembly.
Figure 8:
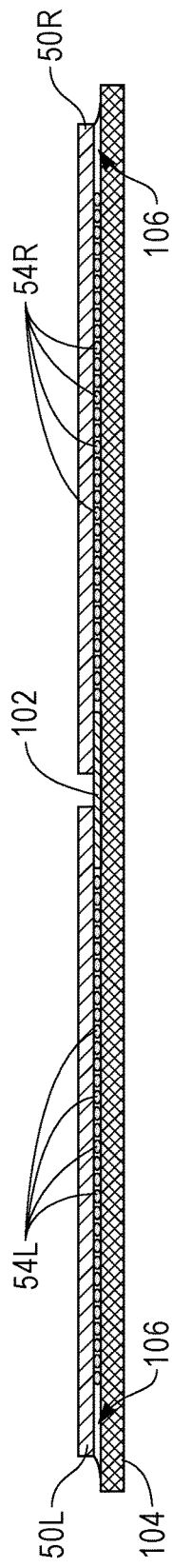
FIG. 8 is a cross sectional view of the fourth assembly of FIG. 7 after performing underfill and removing of the backer structure.

Reference is now made to FIGS. 3-8 which illustrate a method in accordance with a first embodiment of the present application. In the first embodiment, a first assembly A1 as shown in FIG. 3 is first provided. The first assembly includes a first semiconductor die 50L, a second semiconductor die 50R and alignment carrier 10. It is noted that alignment carrier 10 of this embodiment of the present application does not include window 16. A backer structure 100 as shown in FIG. 4 is then attached to the semiconductor die (50L, 50R) of the first assembly A1. Next, the alignment carrier 10 is removed as shown in FIG. 5 to provide a second assembly A2 including the first semiconductor die 50L, the second semiconductor die 50R and the backer structure 100. An interconnect bridge 102 is then attached between the first semiconductor die 50L and the second semiconductor die 50R to provide a third assembly A3 as shown in FIG. 6. The third assembly A3 includes the first semiconductor die 50L, the second semiconductor die 50R, the backer structure 100 and the interconnect bridge 102. In the present application, the interconnect bridge 102 connects the HDI region of the first semiconductor die 50L to the HDI region of the second semiconductor die 50R. Next, a laminate 104 as shown in FIG. 7 is attached to the third assembly A3 to provide a fourth assembly A4. An underfill epoxy 106 as shown in FIG. 8 can be formed. In some embodiments, and as also shown in FIG. 8, the backer structure 100 can be removed from assembly. The method of the first embodiment will now be described in greater detail.

Referring is first made to FIG. 3, there is illustrated a first assembly A1 including the two semiconductor die (50L, 50R) of FIG. 2 aligned and attached to the alignment carrier 10 of FIG. without the window 16. In the present application, the first assembly A1 can be formed by bringing the two semiconductor die (50L, 50R) into intimate contact with the alignment carrier such that a first set of the plurality solder balls 14X located on the substrate 12 is aligned to, and in contact with, the plurality of first sacrificial bond pads (not shown for clarity) located at the periphery region of the first semiconductor die 50L, and a second set of the plurality solder balls 14Y on the substrate 12 is aligned to, and in contact with, the plurality of second sacrificial bond pads (not shown for clarity) located at the periphery region of the second semiconductor die 50R. Solder balls 14X, 14Y correspond with solder balls 14 of FIG. 1.

A mass reflow anneal can then be performed to join the semiconductor die (50L, 50R) to the alignment carrier 10. The semiconductor die (50L, 50R) will align to each other using the self-centering feature of mass reflow, as described above. The mass reflow can be performed utilizing conditions that are well known to those skilled in the art. In one example, the mass reflow can be performed at a peak temperature from 235° C. to 255° C.

Referring now to FIG. 4, there is illustrated the first assembly A1 of FIG. 3 after first attaching a backer structure 100 to a backside of the first semiconductor die 50L and the second semiconductor die 50R. In accordance with the present application, the backside of the first and second die (50L, 50R) is the surface that is opposite a surface that includes the sacrificial bond pads (52L, 52R), solder balls (54L, 54R) and bond pads (56L, 56R).

The backer structure 100 can be composed of any material that has a CTE that substantially matches the CTE of the semiconductor die and such material is well known to those skilled in the art including, for example, silicon, glass, or silicon carbide. In one embodiment, the backer structure 100 can be attached to the backside of the first and second die (50L, 50R) using a high temperature (greater than 260° C.) reworkable tape or liquid adhesive. In such an embodiment, the backer structure 100 can be a temporary structure which can be removed later on in the assembly process. In other embodiments, the backer structure 100 can be a permanent structure if the backer structure 100 is composed of a material that provides minimal impact to the final assembly. Possible impacts to the final assembly could be a combination of mechanical and thermal.

Referring now to FIG. 5, there is illustrated the first assembly A1 of FIG. 4 after removing the alignment carrier 10 to provide a second assembly A2 including the first semiconductor die 50L, the second semiconductor die 50R and the backer structure 100. In some embodiments, the alignment carrier 10 can be removed by re-melting the solder joint formed by the mass reflow mentioned above. In such an embodiment, the structure can be heated to a temperature which melts the solder joint so that the alignment carrier 10 detaches from the second assembly A2. In another embodiment, the alignment carrier 10 can be removed by mechanical shearing. In such an embodiment, a force can be applied which breaks the sacrificial bond pads (52L, 52R) away from the semiconductor die (50L, 50R) such that the solder balls (14X, 14Y) remain on the alignment carrier 10 and are not transferred to the semiconductor die (50L, 50R).

Referring now to FIG. 6, there is illustrated the second assembly A2 of FIG. 5 after second attaching an interconnect bridge 102 between the first semiconductor die 50L and the second semiconductor die 50R to provide a third assembly A3. The third assembly A3 shown in FIG. 6 is rotated 180° from the second assembly shown in FIG. 5. The third assembly A3 includes the first semiconductor die 50L, the second semiconductor die 50R, the backer structure 100 and the interconnect bridge 102. In accordance with the present application, the interconnect bridge 102 connects the HDI region of the first semiconductor die 50L to the HDI region of the second semiconductor die 50R.

In one embodiment, the interconnect bridge 102 is composed of silicon. Other materials besides silicon such as, for example, glass can be used as the interconnect bridge 102. In the first embodiment, the interconnect bridge 102 can be attached with Thermo-Compression Bonding (TCB). TCB allows for copper to copper bonding and the use of a thin (less than 50 micron) interconnect bridge 102.

Referring now to FIG. 7, there is illustrated the third assembly A3 of FIG. 6 after third attaching a laminate 104 to the third assembly A3. The third assembly A3 shown in FIG. 7 is rotated 180° from the third assembly shown in FIG. 6. Laminate 104 includes materials well known to those skilled in the art. For example, laminate 104 can comprise a circuit board made from layers of insulating material and copper wiring. Laminate 104 can be attached to the third assembly shown in FIG. 6 by performing a mass reflow as described above. During this mass reflow process, solder balls (52L, 52R) are reflowed and a solder joint is formed between the laminate 104 and the third assembly A3 of FIG. 6. The assembly shown in FIG. 7 is a fourth assembly that includes, the first semiconductor die 50L, the second semiconductor die 50R, the backer structure 100, the interconnect bridge 102 and the laminate 104. In some embodiments, the fourth assembly A4 is a final assembly of the present application.

Referring now to FIG. 8, there is illustrated the fourth assembly A4 of FIG. 7 after performing underfill and removing of the backer structure 100. In some embodiments, the step of removing the backer structure 100 is not performed.

The underfill process includes forming an underfill epoxy in the space of the fourth assembly A4 that is located between the laminate 104, the first and second semiconductor (50L, 50R) and the interconnect bridge 102. To ensure that the space is completed filled with the underfill epoxy, the fourth assembly is typically heated to enhance flow of the underfill epoxy and initiate curing. In FIG. 8, element 106 denotes a harden underfill epoxy.

In some embodiments, the backer structure 100 can be removed from the final assembly utilizing technique well known to those skilled in the art. In some embodiments, the removal of the backer structure 100 can be performed by a peeling process.

Figure 9:
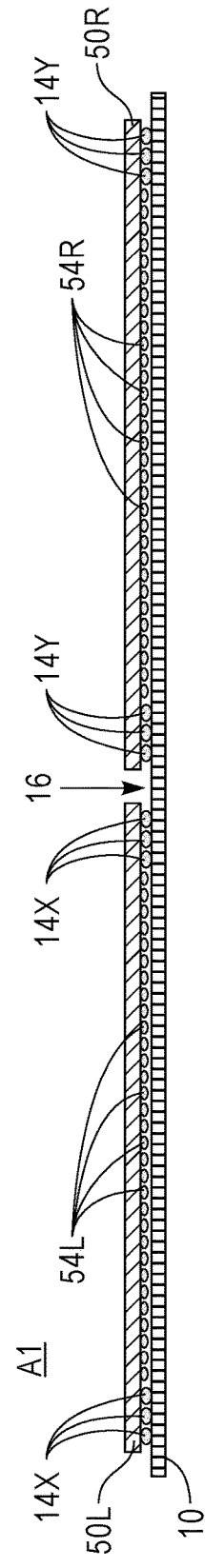
FIG. 9 is a cross sectional view of a first assembly including a first semiconductor die, a second semiconductor die located laterally adjacent to the first semiconductor die, and an alignment carrier including a window in accordance with another embodiment of the present application.
Figure 10:
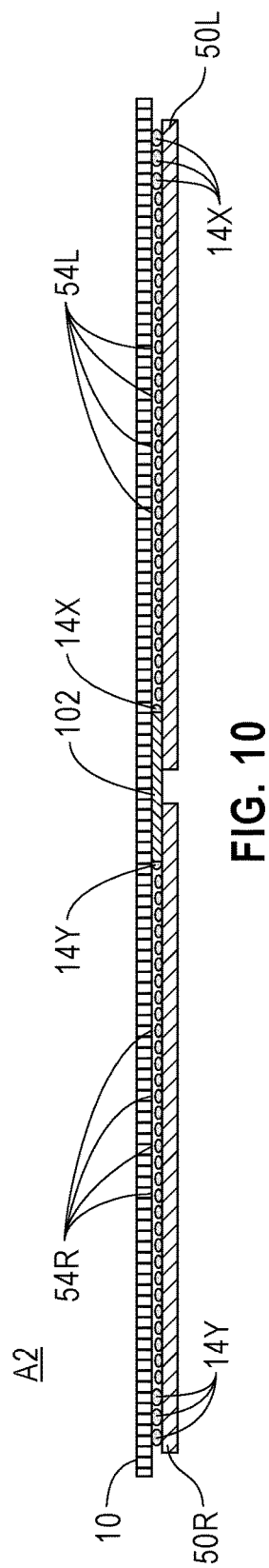
FIG. 10 is a cross sectional view of the first assembly of FIG. 9 after forming an interconnect bridge through the window and spanning the first semiconductor die and the second semiconductor die to provide a second assembly including the first semiconductor die, the second semiconductor die, and the interconnect bridge, wherein the interconnect bridge connects a high density interconnect region of the first semiconductor die to a high density interconnect region of the second semiconductor die.
Figure 11:
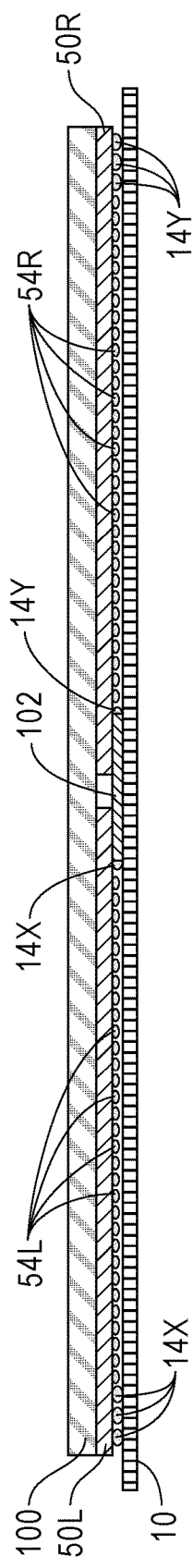
FIG. 11 is a cross sectional view of the second assembly of FIG. 10 after first attaching a backer structure to a backside of the first semiconductor die and the second semiconductor die of the second assembly.
Figure 12:
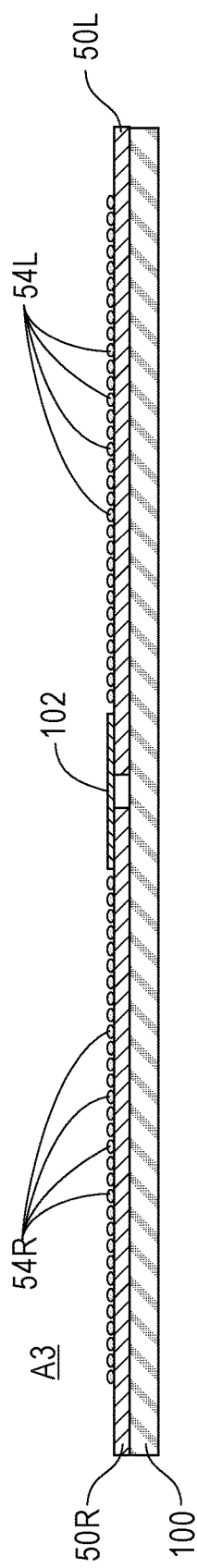
FIG. 12 is a cross sectional view of the second assembly of FIG. 11 after removing the alignment carrier to provide a third assembly including the first semiconductor die, the second semiconductor die, the interconnect bridge and the backer structure.
Figure 13:
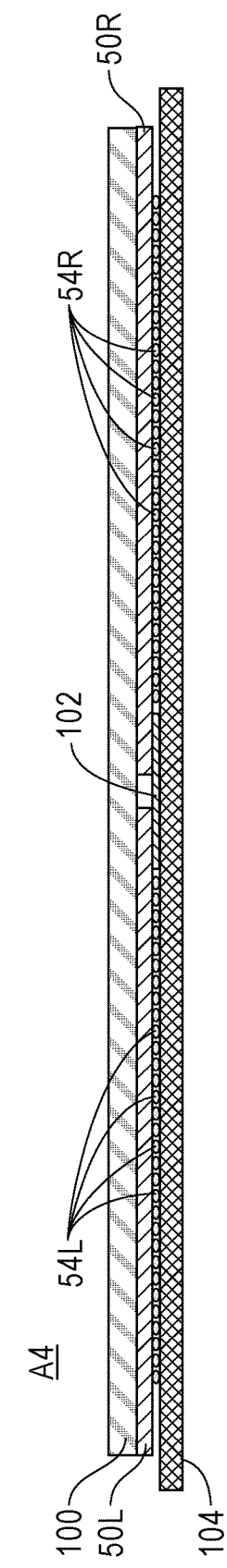
FIG. 13 is a cross sectional view of the third assembly of FIG. 12 after second attaching a laminate to the third assembly to provide a fourth assembly.
Figure 14:
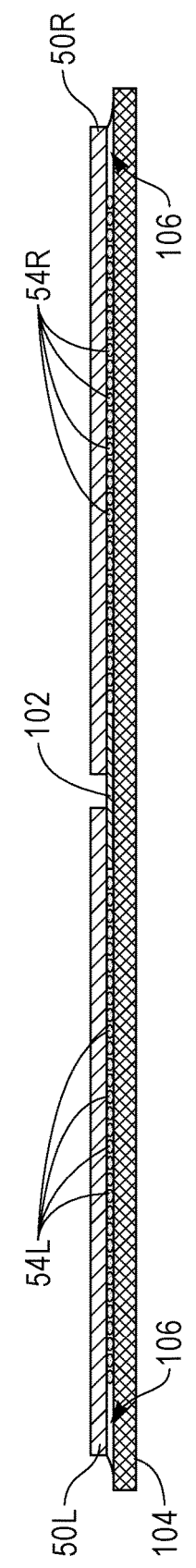
FIG. 14 is a cross sectional view of the fourth assembly of FIG. 13 after performing underfill and removing of the backer structure.

Reference is now made to FIGS. 9-14 which illustrate a method in accordance with a second embodiment of the present application. In the second embodiment, a first assembly A1 as shown in FIG. 9 is first provided. The first assembly A1 includes a first semiconductor die 50L, a second semiconductor die 50R and alignment carrier 10 with a window 16 for bridge placement and alignment. An interconnect bridge 102 as shown in FIG. 10 is then formed through the window 16 of the alignment carrier 10 and spanning the first semiconductor die 50L and the second semiconductor die 50R to provide a second assembly A2 including the first semiconductor die 50L, the second semiconductor die 50R, and the interconnect bridge 102. In accordance with the present application, the interconnect bridge 102 connects the HDI region of the first semiconductor die 50L to the HDI region of the second semiconductor die 50R. A backer structure 100 is then attached to a backside of the first semiconductor die 50R and the second semiconductor die 50L of the second assembly A2. Next, and as shown in FIG. 12, the alignment carrier 10 is removed to provide a third assembly A3 including the first semiconductor die 50L, the second semiconductor die 50R, the interconnect bridge 102 and the backer structure 100. Laminate 104 as shown in FIG. 13 is then attached to the third assembly to provide a fourth assembly A4. An underfill epoxy 106 as shown in FIG. 14 can be formed. In some embodiments, and as also shown in FIG. 14, the backer structure 100 can be removed from assembly. The method of the second embodiment will now be described in greater detail.

Referring is first made to FIG. 9, there is illustrated a first assembly A1 including the two semiconductor die (50L, 50R) of FIG. 2 aligned and attached to the alignment carrier 10 of FIG. 1 with window 16. In the present application, the first assembly A1 can be formed by bringing the two semiconductor die (50L, 50R) into intimate contact with the alignment carrier such that a first set of the plurality solder balls 14X located on the substrate 12 is aligned to, and in contact with, the plurality of first sacrificial bond pads (not shown for clarity) located at the periphery region of the first semiconductor die 50L, and a second set of the plurality solder balls 14Y located on the substrate 12 is aligned to, and in contact with, the plurality of second sacrificial bond pads (not shown for clarity) located at the periphery region of the second semiconductor die 50R. Solder balls 14X, 14Y correspond with solder balls 14 of FIG. 1.

Referring now to FIG. 10, there is illustrated the first assembly A1 of FIG. 9 after forming an interconnect bridge 102 through the window 16 of the alignment carrier 10 and spanning the first semiconductor die 50L and the second semiconductor die 50R to provide a second assembly A2. The second assembly A2 shown in FIG. 10 is rotated 180° from the first assembly shown in FIG. 9. The second assembly A2 includes the first semiconductor die 50L, the second semiconductor die 50R, and the interconnect bridge 102. In accordance with the present application, the interconnect bridge 102 connects the HDI region of the first semiconductor die 50L to the HDI region of the second semiconductor die 50R.

In one embodiment, the interconnect bridge 102 is composed of silicon. Other materials besides silicon such as, for example, glass can be used as the interconnect bridge 102. In the second embodiment, the interconnect bridge 102 can be attached using a mass reflow process. During the mass reflow process, the semiconductor dies can re-align and self-center with the interconnect bridge 102. In the second embodiment, the window 16 that is present in the alignment carrier 10 allows access within the first assembly A1 for interconnect bridge 102 attachment.

Referring now to FIG. 11, there is illustrated the second assembly A2 of FIG. 10 after first attaching a backer structure 100 to a backside of the first semiconductor die 50L and the second semiconductor die 50R of the second assembly A2. The second assembly A2 shown in FIG. 11 is rotated 180° from the second assembly shown in FIG. 10. The backer structure 100 of this embodiment of the present application is the same as in the previous embodiment of the present application.

Referring now to FIG. 12, there is illustrated the second assembly A2 of FIG. 11 after removing the alignment carrier 10 to provide a third assembly A3 including the first semiconductor die 50L, the second semiconductor die 50R, the interconnect bridge 102 and the backer structure 100. The third assembly A3 shown in FIG. 12 is rotated 180° from the second assembly shown in FIG. 11. The removal of the alignment carrier 10 used in this embodiment of the present application can include a heating process or a mechanical shear process as mentioned above.

Referring now to FIG. 13, there is illustrated the third assembly A3 of FIG. 12 after second attaching a laminate 104 to the third assembly A3. Laminate 104 includes one of materials mentioned above. Laminate 104 can be attached to the third assembly using a mass reflow anneal as defined above for the previous attachment of the laminate 104. A fourth assembly A4 is provided that includes, the first semiconductor die 50L, the second semiconductor die 50R, the interconnect bridge 102, the backer structure 100 and the laminate 104. The fourth assembly A3 shown in FIG. 13 is rotated 180° from the third assembly shown in FIG. 12.

Referring now to FIG. 14, there is illustrated the fourth assembly A4 of FIG. 13 after performing underfill and removing of the backer structure 100. In some embodiments, the step of removing the backer structure 100 is not performed.

The underfill process includes forming an underfill epoxy in the space of the fourth assembly A4 that is located between the laminate 104, the first and second semiconductor (50L, 50R) and the interconnect bridge 102. To ensure that the space is completed filled with the underfill epoxy, the fourth assembly is typically heated to enhance flow of the underfill epoxy and initiate curing of the underfill epoxy. In FIG. 14, element 106 denotes a harden underfill epoxy.

In some embodiments, the backer structure 100 can be removed from the final assembly utilizing technique well known to those skilled in the art. In some embodiments, the removal of the backer structure 100 can be performed by a peeling process.

Figure 15:
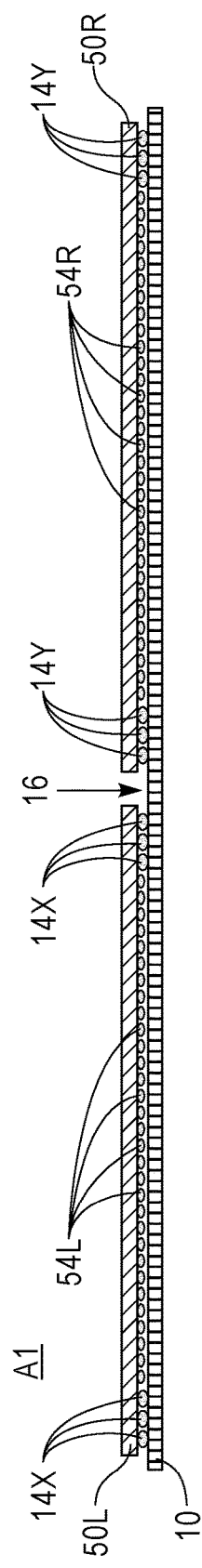
FIG. 15 is a cross sectional view of a first assembly including a first semiconductor die, a second semiconductor die located laterally adjacent to the first semiconductor die, and an alignment carrier including a window in accordance with yet another embodiment of the present application.
Figure 16:
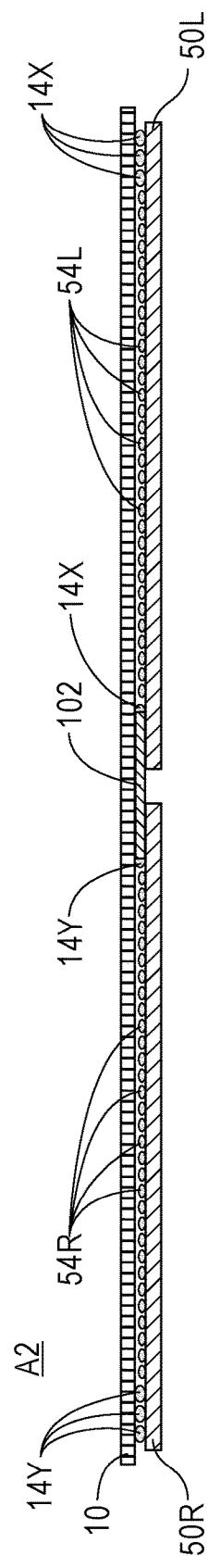
FIG. 16 is a cross sectional view of the first assembly of FIG. 15 after forming an interconnect bridge through the window and spanning the first semiconductor die and the second semiconductor die to provide a second assembly including the first semiconductor die, the second semiconductor die, and the interconnect bridge, wherein the interconnect bridge connects a high density interconnect region of the first semiconductor die to a high density interconnect region of the second semiconductor die.
Figure 17:
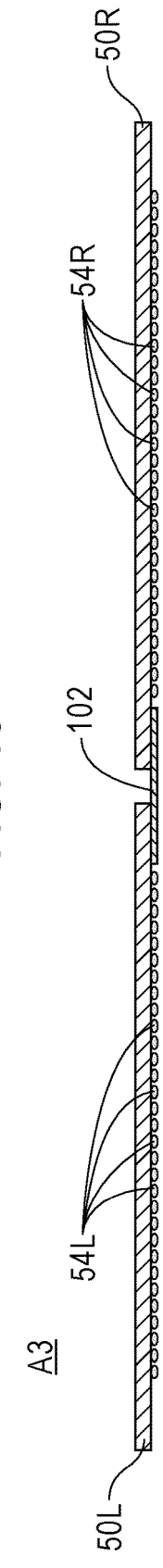
FIG. 17 is a cross sectional view of the second assembly of FIG. 16 after removing the alignment carrier to provide a third assembly including the first semiconductor die, the second semiconductor die and the interconnect bridge.
Figure 18:
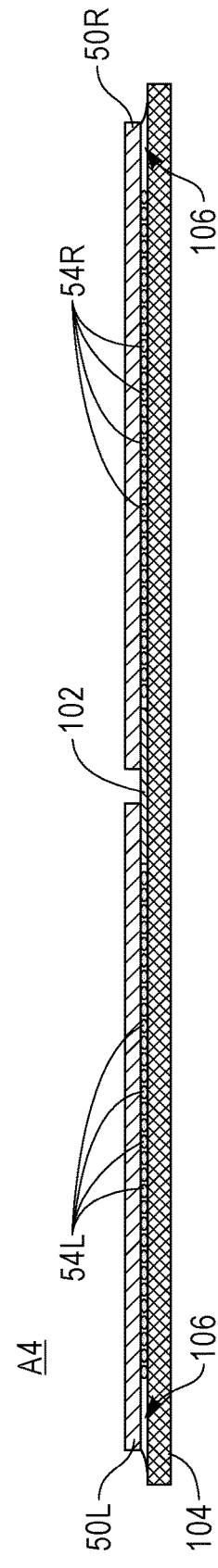
FIG. 18 is a cross sectional view of the third assembly of FIG. 17 after attaching a laminate to the third assembly to provide a fourth assembly, and after performing underfill.

Reference is now made to FIGS. 15-18 which illustrate a method in accordance with a third embodiment of the present application. The third embodiment of the present application is similar to the second embodiment except no backer structure is employed. In the third embodiment, a first assembly A1 as shown in FIG. 15 is first provided. The first assembly A1 includes a first semiconductor die 50L, a second semiconductor die 50R and alignment carrier 10 with an alignment window 16. An interconnect bridge 102 as shown in FIG. 16 is then formed through the window 16 of the alignment carrier 10 and spanning the first semiconductor die 50L and the second semiconductor die 50R to provide a second assembly A2 including the first semiconductor die 50L, the second semiconductor die 50R, and the interconnect bridge 102. In accordance with the present application, the interconnect bridge 102 connects the HDI region of the first semiconductor die 50L to the HDI region of the second semiconductor die 50R. Next, and as shown in FIG. 17, the alignment carrier 10 is removed to provide a third assembly A3 including the first semiconductor die 50L, the second semiconductor die 50R, and the interconnect bridge 102. Laminate 104 as shown in FIG. 18 is then attached to the third assembly to provide a fourth assembly A4. An underfill epoxy 106 as shown in FIG. 18 can be formed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
providing a first assembly comprising a first semiconductor die, a second semiconductor die located laterally adjacent to the first semiconductor die, and an alignment carrier, wherein the first semiconductor die comprises a plurality of first sacrificial bond pads located at a periphery region of the first semiconductor die, first solder balls located in a low density interconnect (LDI) region of the first semiconductor die and first bond pads located in a high density interconnect (HDI) region of the first semiconductor die, the second semiconductor die comprises a plurality of second sacrificial bond pads located at a periphery region of the second semiconductor die, second solder balls located in a LDI region of the second semiconductor die and second bond pads located in a HDI region of the second semiconductor die, and the alignment carrier comprises a substrate having a coefficient of thermal expansion that substantially matches that of an interconnect bridge, and a plurality of solder balls located on the substrate, wherein a first set of the plurality solder balls located on the substrate are aligned to, and in contact with, the plurality of first sacrificial bond pads located at the periphery region of the first semiconductor die, and a second set of the plurality solder balls located on the substrate are aligned to, and in contact with, the plurality of second sacrificial bond pads located at the periphery region of the second semiconductor die;
first attaching a backer structure to a backside of the first semiconductor die and the second semiconductor die;
removing the alignment carrier to provide a second assembly comprising the first semiconductor die, the second semiconductor die and the backer structure;
second attaching the interconnect bridge between the first semiconductor die and the second semiconductor die to provide a third assembly comprising the first semiconductor die, the second semiconductor die, the backer structure and the interconnect bridge, wherein the interconnect bridge connects the HDI region of the first semiconductor die to the HDI region of the second semiconductor die; and
third attaching a laminate to the third assembly.

2. The method of claim 1, further comprising removing the backer structure from the third assembly.

3. The method of claim 1, wherein the third attaching comprises a mass reflow of the first and second solder balls.

4. The method of claim 1, wherein the plurality of first sacrificial bond pads are formed at the same time as the first bond pads in the HDI region of the first semiconductor die, and the plurality of second sacrificial bond pads are formed at the same time as the second bond pads in the HDI region of the second semiconductor die.

5. The method of claim 1, further comprising removing the backer structure after the third attaching of the laminate.

6. A method comprising:
providing a first assembly comprising a first semiconductor die, a second semiconductor die located laterally adjacent to the first semiconductor die, and an alignment carrier, wherein the first semiconductor die comprises a plurality of first sacrificial bond pads located at a periphery region of the first semiconductor die, first solder balls located in a low density interconnect (LDI) region of the first semiconductor die and first bond pads located in a high density interconnect (HDI) region of the first semiconductor die, the second semiconductor die comprises a plurality of second sacrificial bond pads located at a periphery region of the second semiconductor die, second solder balls located in a LDI region of the second semiconductor die and second bond pads located in a HDI region of the second semiconductor die, and the alignment carrier comprises a substrate having a coefficient of thermal expansion that substantially matches that of an interconnect bridge, a window located in a central portion of the substrate, and a plurality of solder balls located on the substrate, wherein a first set of the plurality solder balls located on the substrate is aligned to, and in contact with, the plurality of first sacrificial bond pads located at the periphery region of the first semiconductor die, and a second set of the plurality solder balls located on the substrate is aligned to, and in contact with, the plurality of second sacrificial bond pads located at the periphery region of the second semiconductor die;
forming the interconnect bridge through the window and spanning the first semiconductor die and the second semiconductor die to provide a second assembly comprising the first semiconductor die, the second semiconductor die, and the interconnect bridge, wherein the interconnect bridge connects the HDI region of the first semiconductor die to the HDI region of the second semiconductor die;

first attaching a backer structure to a backside of the first semiconductor die and the second semiconductor die of the second assembly;

removing the alignment carrier to provide a third assembly comprising the first semiconductor die, the second semiconductor die, the interconnect bridge and the backer structure; and second attaching a laminate to the third assembly.

7. The method of claim 6, wherein the third attaching comprises a mass reflow of the first and second solder balls.

8. The method of claim 6, wherein the plurality of first sacrificial bond pads are formed at the same time as the first bond pads in the HDI region of the first semiconductor die, and the plurality of second sacrificial bond pads are formed at the same time as the second bond pads in the HDI region of the second semiconductor die.

9. The method of claim 6, further comprising removing the backer structure after the second attaching of the laminate.

10. A method comprising:

providing a first assembly comprising a first semiconductor die, a second semiconductor die located laterally adjacent to the first semiconductor die, and an alignment carrier, wherein the first semiconductor die comprises a plurality of first sacrificial bond pads located at a periphery region of the first semiconductor die, first solder balls located in a low density interconnect (LDI) region of the first semiconductor die and first bond pads located in a high density interconnect (HDI) region of the first semiconductor die, the second semiconductor die comprises a plurality of second sacrificial bond pads located at a periphery region of the second semiconductor die, second solder balls located in a LDI region of the second semiconductor die and second bond pads located in a HDI region of the second semiconductor die, and the alignment carrier comprises a substrate having a coefficient of thermal expansion that substantially matches that of an interconnect bridge, a window located in a central portion of the substrate, and a plurality of solder balls located on the substrate, wherein a first set of the plurality solder balls located on the substrate is aligned to, and in contact with, the plurality of first sacrificial bond pads located at the periphery region of the first semiconductor die, and a second set of the plurality solder balls located on the substrate is aligned to, and in contact with, the plurality of second sacrificial bond pads located at the periphery region of the second semiconductor die;

forming the interconnect bridge through the window and spanning the first semiconductor die and the second semiconductor die to provide a second assembly comprising the first semiconductor die, the second semiconductor die, and the interconnect bridge, wherein the interconnect bridge connects the HDI region of the first semiconductor die to the HDI region of the second semiconductor die;

removing the alignment carrier to provide a second assembly comprising the first semiconductor die, the second semiconductor die, and the interconnect bridge; and attaching a laminate to the second assembly.

11. The method of claim 10, wherein the plurality of first sacrificial bond pads are formed at the same time as the first bond pads in the HDI region of the first semiconductor die, and the plurality of second sacrificial bond pads are formed at the same time as the second bond pads in the HDI region of the second semiconductor die.

* * * * *